United States Patent
Guo et al.

(10) Patent No.: US 8,004,340 B2
(45) Date of Patent: Aug. 23, 2011

(54) SYSTEM AND METHOD FOR A SEMICONDUCTOR SWITCH

(75) Inventors: Dianbo Guo, Singapore (SG); Eng Jye Ng, Singapore (SG); Kien Beng Tan, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 0 days.

(21) Appl. No.: 12/633,597

(22) Filed: Dec. 8, 2009

(65) Prior Publication Data
US 2011/0133810 A1 Jun. 9, 2011

(51) Int. Cl.
*H03L 5/00* (2006.01)
(52) U.S. Cl. .............. 327/333; 327/365; 326/62; 326/81
(58) Field of Classification Search .................. 327/306, 327/333, 536–537, 374–376; 326/62–63, 326/80–81
See application file for complete search history.

(56) References Cited

U.S. PATENT DOCUMENTS

| | | | |
|---|---|---|---|
| 6,154,085 A | 11/2000 | Ramakrishnan | |
| 6,671,147 B2 * | 12/2003 | Ker et al. | 361/56 |
| 6,958,519 B2 * | 10/2005 | Gonzalez et al. | 257/402 |
| 7,586,155 B2 * | 9/2009 | Kapoor | 257/363 |

OTHER PUBLICATIONS

"USB 2.0 High-Speed and Audio Switches with Negative Signal Capability," Datasheet, Max14508E-Max14511E/Max14509AE, Rev. Mar. 2008, pp. 1-14, Maxim, Sunnyvale, Ca.

* cited by examiner

*Primary Examiner* — Dinh T. Le
(74) *Attorney, Agent, or Firm* — Lisa K. Jorgenson; Steven H. Slater (57) ABSTRACT

In one embodiment, a semiconductor circuit for coupling a first node to a second node includes a first transistor having a first terminal coupled to the first node, a second terminal coupled to the second node, and a control terminal coupled to a control node. The circuit also includes a level shifting circuit having a series diode for coupling a bulk terminal of the first transistor to the control node, and a supply coupling circuit coupled between a first power supply node and the control node.

18 Claims, 5 Drawing Sheets

SYSTEM AND METHOD FOR A SEMICONDUCTOR SWITCH

TECHNICAL FIELD

This invention relates generally to electronic circuits, and more particularly to a system and method for a semiconductor switch.

BACKGROUND

Figure 1:
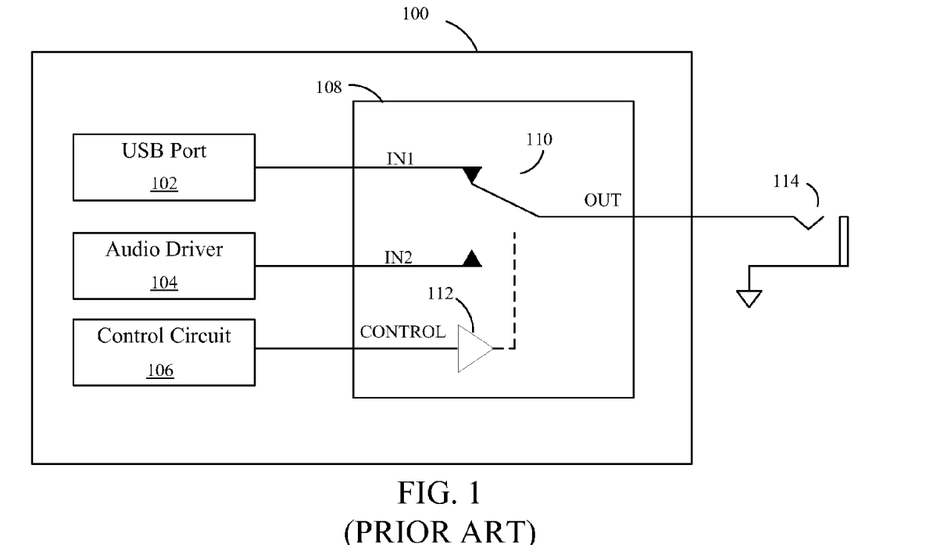
FIG. 1 illustrates a schematic of a semiconductor switch application.

Semiconductor switches are widely used as basic circuit components and provide system level design flexibility. For example, in audio applications, semiconductor switches are used to select a single audio output from multiple audio source channels. Another example of a typical semiconductor switch application is illustrated in FIG. 1. In cellular phone 100 semiconductor switch circuit 108 is used to share signal jack 114 with USB port 102 and audio driver 104. By sharing single signal jack 114, the number of external signal interfaces on cellphone 100 can be reduced. Control circuit 106 asserts a control signal that activates internal logic 112 to change the state of single pole double throw (SPDT) switch 110. Signal jack 114 can then be coupled to a computer via a USB cable, or to a loudspeaker via an audio cable depending on the mode of operation of cellphone 100.

Figure 2:
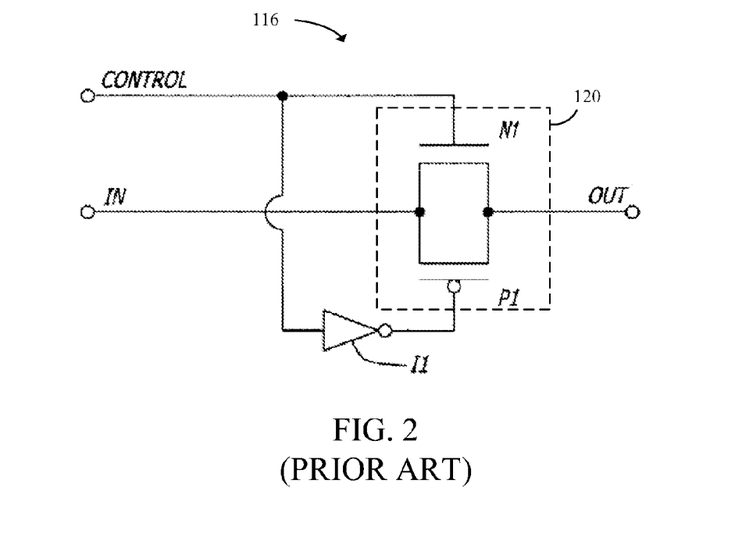
FIG. 2 illustrates a schematic of a prior art semiconductor switch.

FIG. 2 illustrates a conventional semiconductor switch 116 using a CMOS transmission gate 120. Transmission gate 120 has NMOS transistor N1 and PMOS transistor P1 that couples signal IN with signal OUT depending on the state of signal CONTROL. Signal CONTROL is coupled to gate of NMOS transistor N1 directly and to the gate of PMOS transistor P1 via inverter I1. During operation, when signal CONTROL is high, both NMOS transistor N1 and PMOS transistor P1 are ON. When signal CONTROL is low, both NMOS transistor N1 and PMOS transistor P1 are OFF. The on-resistance of the CMOS transmission gate, however, depends on the bias point of transistors N1 and P1. Generally, the on-resistance of CMOS transmission gate 120 will vary according to the power supply voltage (not shown) and the voltages of signals IN and OUT. When the power supply voltage is low, the variation of the on-resistance of CMOS transmission gate 120 can vary considerably with respect to signals IN and OUT.

In some audio applications, such as headphone and speaker drivers, the variation in on-resistance of a CMOS switch can introduce undesirable distortion in an audio signal. The audio signal suffers even more distortion if signals IN and OUT coupled to CMOS switch 120 are operated outside of the power supply range of the switch 116. For example, if the signals IN and OUT are at 0V and have an appreciable peak-to-peak amplitude, the resulting audio signal may be significantly distorted. Some prior art solutions, such as the constant gate drive MOS analog switch described in U.S. Pat. No. 6,154,085, address the issue of resistance variation by providing a constant gate drive to a switch transistor. The prior art circuit, however, consumes power and does not provide a constant gate drive for signals outside of the power supply range, thereby resulting in the distortion of moderate to large audio signals biased at 0V.

In the field of power supplies, what are needed are power efficient semiconductor switches that provide low on-resistance variation.

SUMMARY

In one embodiment, a semiconductor circuit for coupling a first node to a second node is disclosed. The circuit includes a first transistor having a first terminal coupled to the first node, a second terminal coupled to the second node, and a control terminal coupled to a control node. The circuit also includes a level shifting circuit having a series diode for coupling a bulk terminal of the first transistor to the control node, and a supply coupling circuit coupled between a first power supply node and the control node.

In another embodiment, a switching circuit for coupling a first node to a second node is disclosed. The switching circuit includes a first transistor coupled between the first node and the second node, a second transistor coupled between the first node and a bulk node of the first transistor, and a third transistor coupled between the second node and the bulk node of the first transistor. The circuit also includes a level shifting circuit coupled between the second node and a control node, a current source coupled between the control node and a first power supply node, and a switch coupled between the control node and a second power supply node. The switch includes a control input, where the control node is coupled to control terminals of the first, second and third transistors. The level shifting circuit includes a diode.

In a further embodiment, a semiconductor circuit is disclosed. The semiconductor circuit has a first MOS transistor that includes a drain coupled to a first node, a source coupled to a second node, a gate coupled to a control node, and a body coupled to a bulk node. The semiconductor circuit also includes a second MOS transistor having a drain coupled to the first node, a source coupled to the bulk node, a gate coupled to the control node, and a body coupled to the bulk node. A third MOS transistor includes a drain coupled to the second node, a source coupled to the bulk node, a gate coupled to the control node, and a body coupled to the bulk node. The semiconductor circuit further includes a diode connected MOS device coupled between the second node and the control node, a current source coupled between a first power supply node and the control node; and a switch coupled between the control node and a second power supply node, the switch configured to be activated by an enable signal. In a further embodiment, a resistor is coupled in series with the diode connected MOS device. In some embodiments, the semiconductor circuit includes a charge pump coupled to the first power supply node, the charge pump configured to provide a boosted supply voltage.

In a further embodiment, the diode connected MOS device of the semiconductor circuit has a plurality of diodes connected MOS devices coupled in series. In an embodiment, the first, second and third transistors are NMOS transistors, and the plurality of diode connected MOS devices has a fourth and fifth NMOS transistor. The fourth NMOS transistor has a fourth gate, a fourth drain and a fourth bulk node coupled to the control node. The fifth NMOS transistor has a fifth gate and a fifth drain coupled to a fourth source of the fourth NMOS transistor, and a fifth source and a fifth bulk node coupled to the second node. In an embodiment, the second power supply node is coupled to a negative voltage. In a further embodiment, the semiconductor circuit also has a resistor coupled in series with the plurality of diode connected MOS devices.

In a further embodiment, a method of operating a semiconductor switch having a first transistor coupled between the first node and the second node, a second transistor coupled between the first node and a bulk node of the first transistor, a third transistor coupled between the second node and the bulk node of the first transistor, a level shifting circuit coupled between the second node and a control node, a current source coupled between the control node and a first power supply node is disclosed. The control node is coupled to control terminals of the first, second and third transistors, and the level shifting circuit comprises a diode. The method includes enabling the semiconductor switch, which includes the step of opening a control switch coupled between the control node and a second power supply node to allow current to flow current source through the level shifter. Opening the control switch includes changing a state of an enable signal coupled to the control switch to a second state. The method also includes biasing the first transistor with a voltage across the level shifter to achieve a fixed resistance between the first node and the second node. In a further embodiment, the fixed resistance changes less than 2% over an input voltage of between −1.5V and 1.5V at the first node In a further embodiment, the method further includes disabling the semiconductor switch and shutting off the transistor. Disabling includes closing the control switch to prevent current from flowing though the level shifter, and closing includes changing the state of the enable signal coupled to the control switch to a second state.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present disclosure will be described with respect to embodiments in a specific context, namely a system and method for a semiconductor switch. Embodiments of this invention may also be applied to other circuits and systems that require low resistance variation.

Figure 3:
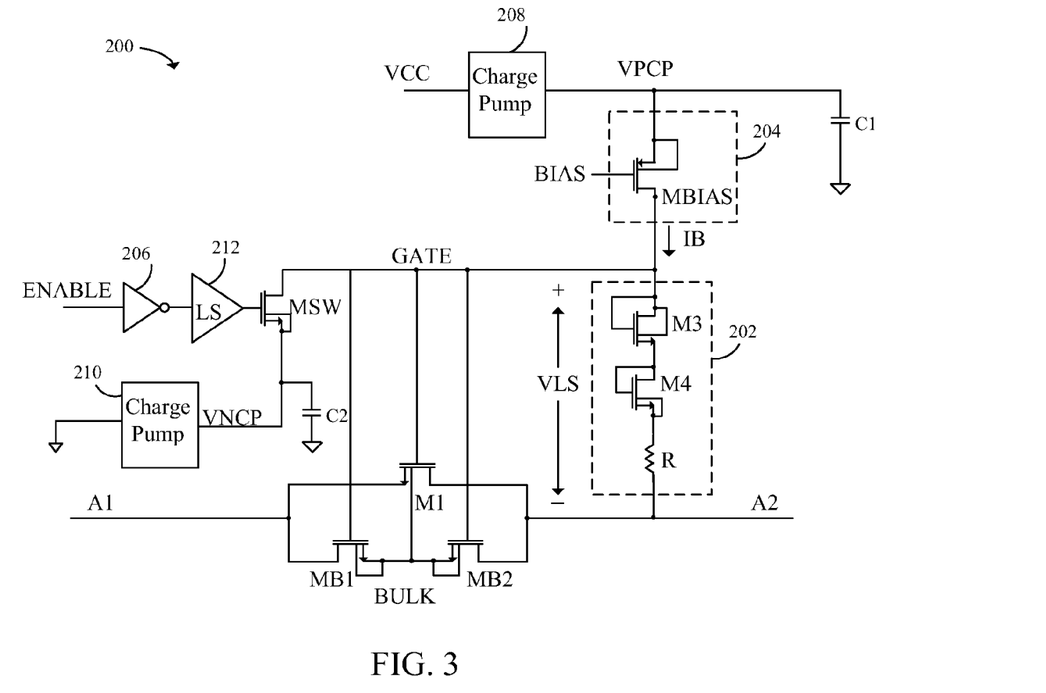
FIG. 3 illustrates a schematic of an embodiment semiconductor switch.

FIG. 3 illustrates a semiconductor switch 200, according to an embodiment of the present disclosure. Switch 200 has a transistor M1 coupled between signal inputs A1 and A2, which forms a primary conduction path. In an embodiment, transistor M1 is implemented as an n-channel MOSFET (NMOS) device, however, in alternative embodiments, other device types can be used, such as a p-channel MOSFET (PMOS) device, a native device, or another transistor device type. Transistors MB1 and MB2 are coupled to the bulk node of M1 and to signal inputs A1 and A2. Level shifter 202 is coupled between signal input A2 and the gate of transistor M1 at node GATE. Switch transistor MSW is coupled between node GATE and negative supply voltage VNCP supplied by charge pump 210. In an alternative embodiment, the source and/or bulk node of switch transistor MSW can be grounded. Inverter 206 and logic level shifter 212 are coupled between signal ENABLE and the gate of MSW. Current source 204, which is supplied by charge pump 208, provides bias current IB to level shifter 202. In an embodiment, semiconductor switch 200 is coupled to a useful circuit. For example, node A1 can be coupled to the output of an audio amplifier and node A2 can be coupled to a loudspeaker. Alternatively, semiconductor switch 200 can be coupled to other circuits.

To turn on switch 200, signal ENABLE is set high, which turns off transistor MSW via inverter 206. Current IB flows from current source 204 through level shifter 202, which biases the gate of M1 at voltage offset VLS from the source/drain terminal of transistor M1. To turn off switch 200, signal ENABLE is set low, the gate to transistor MSW is brought high, thereby turning on transistor MSW. Transistor MSW sinks current IB and pulls node GATE to voltage VNCP, thereby shutting off transistor M1. In an embodiment, transistor MSW is implemented using a NMOS device with its bulk coupled to VNCP. In alternative embodiments, other device types can be used to turn off transistor M1, for example, a native device, a PMOS device, or a BJT device, for example. In embodiments where M1, is implemented as a PMOS device, MSW can also be implemented as a PMOS device. In a further embodiment, current source 204 and/or charge pump 208 can be configured to be deactivated as well when semiconductor switch 200 is turned OFF.

In an embodiment, VCC is between about 3V and about 3.6V. Charge pump 208 boosts VCC to between about 5.7V and 6.3V at node VPCP. Charge pump 210, on the other hand, boosts the ground node down to about negative 3V. Capacitors C1 and C2, which are each between about 1 pF and about 20 pF filters charge pump outputs VPCP and VNCP, respectively to reduce ripple. Charge pumps 208 and 210 are implemented using a capacitive voltage doublers. Alternatively, other voltage boosting techniques known in the art can be used. In alternative embodiments, other voltage ranges for VCC, VPCP and VNCP can be used depending on the particular process, application and specifications. In other alternative embodiments charge pump 208 and/or charge pump 210 can be omitted and voltage reference nodes VPCP and/or VNCP can be coupled to external power supplies. For embodiments described in this disclosure, VCC, VPCP, VNCP are referred to interchangeably as power supplies and power supply nodes.

In an embodiment, VPCP is set to be larger than the input signal range by at least (VLS+0.4)V, where VLS is the voltage across level shifter 202. For example, if voltage VLS is chosen to be 1.5V, an input signal range of −2V to 2V can be accommodated. VPCP, therefore, is chosen to be greater than (2+1.5+0.4)=3.9V, which is satisfied by having VPCP between 5.7V and 6.3V. In another example embodiment, VCC is about 5V and the input signal range is between 0V and 5V. VPCP, therefore, is set to be greater than (5+1.5+0.4)=6.9V. In alternative embodiments, other voltage ranges can used according to the available power supply and required input voltage range.

Current source 204 is implemented by PMOS transistor MBIAS to produce bias current IB for level shifter 202. The gate of MBIAS is set by voltage BIAS, which is generated using biasing techniques known in the art. In an embodiment, IB is set to between about 50 nA and 1 µA. In alternative embodiments, other current source structures can be used to implement current source 204. For example, a resistor degenerated current source, a cascode current source, a current mirror, or a resistor can be used. Alternatively other device types besides a PMOS device can be used, such as a NMOS device, bipolar device or other transistor types depending on the process, specifications, and the polarity of the circuit being implemented.

In an embodiment, a triple-well CMOS process is used that allows for NMOS devices to sit in their own p-well. NMOS transistors MB1 and MB2 are, therefore, coupled between the bulk node of transistor M1 and input nodes A1 and A2, respectively. The bulk nodes of MB1 and MB2 are also coupled to the bulk node of M1, as well. In alternative embodiments that do not allow for NMOS devices to have their own p-well, the bulk of NMOS devices M1, MB1 and MB2 can be connected to ground or other substrate potential. Alternatively, if switch 200 is implemented using PMOS devices for M1, MB1 and MB2, the PMOS devices can be each be implemented in a common n-well or in individual n-wells. In further alternative embodiments, other processes, such as silicon on insulator (SOI) can be used as well.

When signal ENABLE is brought high and current flows though the level shifter, the voltage at node GATE is about VA2+VLS, where VA2 is the voltage at node A2 and VLS is the voltage across the level shifter. It can be seen that if the bulk of M1 is coupled to A2 through transistor MB2, the gate-source voltage and the gate-bulk voltage of M1 is essentially independent of the A2. The turn-on resistance of R1, therefore, has a very small variation over a range of voltages for A1 and A2, assuming that A1 is at about the same voltage as A2.

In an embodiment, level shifter 202 has diode connected NMOS devices M3 and M4 coupled in series with resistor R. M3 and M4 are connected as diodes to prevent reverse current flow when switch 200 is OFF. The gate of M3 is coupled to the drain of M3, and the gate of M4 is coupled to the drain of M4. The bulk node of M3 is coupled to the drain of M3 because back-to-back connected bulk diode can prevent current flowing from node A2 to node gate. The bulk node of M4 is coupled to the source of M4 to accommodate negative voltages at input node A1.

When current $I_B$ flows though embodiment level shifter 202, the voltage across the level shifter 202 $VLS=VGS_{M3}+VGS_{M4}+I_B R$. In an embodiment, $VGS_{M4}$ and $VGS_{M3}$ has a negative temperature coefficient because of the low bias current. R is selected to have a positive temperature coefficient in order to compensate for the negative temperature variation of $VGS_{M4}$ and $VGS_{M3}$. R can be implemented, for example, as a polysilicon resistor with a positive temperature coefficient. In an exemplary embodiment, R is between about 80 kΩ and 200 kΩ, however, other values can be used depending on the particular embodiment and specifications. The resulting voltage VLS across level shifter 202 can be designed to be nearly constant over temperature, or can be designed to have a temperature variation that minimizes the variation of the on-resistance of M1 over temperature. These parameters are optimized according to techniques known in the art.

In an embodiment, transistor M1 is sized and biased so that the on resistance of M1 is nominally about 2.5Ω. When node A1 is varied from −1.5V to 1.5V, which is a typical range for audio applications, the on resistance varies by about 0.004Ω when M1 is conducting about 10 mA. When node A1 is varied from 0V to 3.3V, which is a typical range for USB applications, the on-resistance varies by 0.034Ω when M1 is conducting about 10 mA. In embodiments, the on resistance varies less than 2% over input voltage, thereby providing a fixed resistance. In alternative embodiments of the present invention, the on-resistance and its variation may vary according to the particular implementation, process and operating conditions.

Figure 4A:
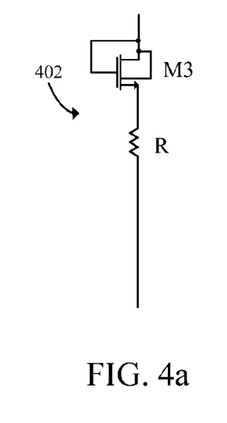
FIGS. 4a-4f illustrate a schematics of embodiment level shifters.

FIGS. 4a-4f illustrate example embodiment level shifters that can be used in place of level shifter 202 in FIG. 3. The level shifters shown in 4a-4f are non-exhaustive examples of alternative level shifters. FIG. 4a illustrates an embodiment level shifter 402 having a single diode connected NMOS device M3 coupled in series with resistor R. The bulk node of M3 is coupled to the drain of M3 because current will not flow from source to drain when drain has lower potential than source. Alternatively, the bulk of M3 can be coupled to its source, or to another voltage.

Figure 4B:
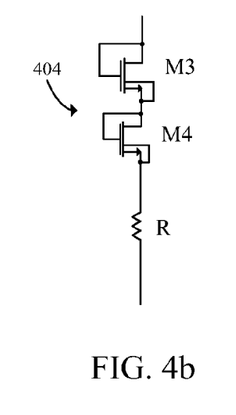
Figure 4C:
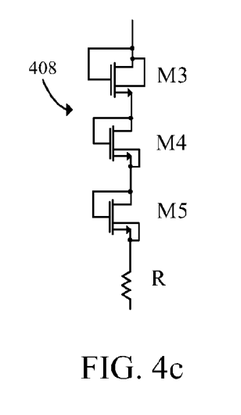

FIG. 4b illustrates embodiment level shifter 404 having two diode connected transistors M3 and M4 coupled in series with resistor R. The bulk of M3 is tied to the source of M3, and the bulk of M4 is tied to the bulk of M4. FIG. 4c illustrates embodiment level shifter 408 having three diode connected transistors M3, M4 and M5 coupled in series with resistor R. The bulk of M3 is coupled to the drain of M3, the bulk of M4 is coupled to the source of M4, and the bulk of M5 is coupled to the source of M5.

Figure 4D:
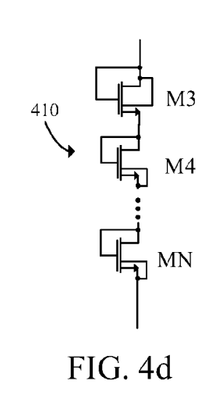

FIG. 4d illustrates embodiment level shifter 410 having an arbitrary number of diode connected transistors M3 and M4 through MN. The bulk of M3 is coupled to the drain of M3, and the bulk of each of M3 through MN are each coupled to their own source. Alternatively, the bulk of M3 can be coupled to the source of M3 and/or a resistor can be coupled in series with the devices.

Figure 4E:
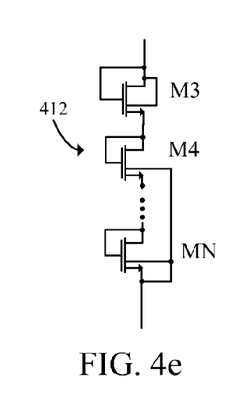
Figure 4F:
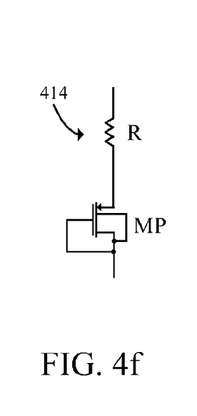

FIG. 4e illustrates embodiment level shifter 412 also having an arbitrary number of diode connected transistors M3 and M4 through MN. The bulk of M3 is coupled to the drain of M3, and the bulk of each of M3 through MN are all coupled to the source of MN. FIG. 4f illustrates embodiment level shifter 414 having diode connected PMOS transistor MP coupled in series with resistor R. The bulk of MP is coupled to the drain of MP, however, in alternative embodiments, the bulk of MP can be coupled to the source of MP, or to another voltage, such as VCC.

Figure 5A:
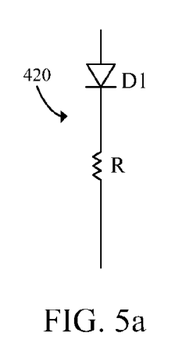
FIGS. 5a-5e illustrate schematics of further embodiment level shifters.
Figure 5B:
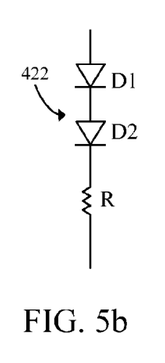
Figure 5C:
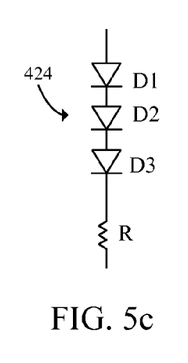
Figure 5D:
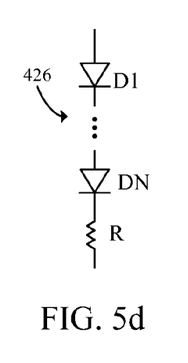
Figure 5E:
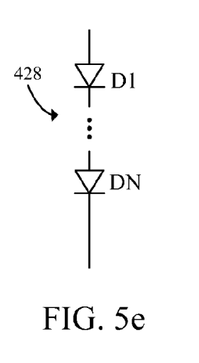

FIGS. 5a-5e illustrate further embodiment level shifters using diode devices. FIG. 5a illustrates level shifter 420 having diode D1 in series with resistor R; FIG. 5b illustrates level shifter 422 having diodes D1 and D2 in series with resistor R; and FIG. 5c illustrates level shifter 424 having diodes D1, D2 and D3 in series with resistor R. FIG. 5d shows level shifter 426 having an arbitrary number of diodes, D1 though DN, in series with resistor R; and FIG. 5e shows level shifter 428 having an arbitrary number of series connected diodes, D1 though DN. The diodes shown in FIGS. 5a-5e can be implemented using diode structures known in the art, for example, junction diodes, Schottky diodes, zener diodes, diode connected transistors, and other diode structures. Junction diodes can be implemented using doped polysilicon, diffusion junctions, or other junction type available in the particular semiconductor process being used.

It can be appreciated that other embodiment level shifters that are not depicted in FIGS. 4a-4f and FIGS. 5a-5e are possible. For example, different device combinations can be used using different device types and different bulk connections. The choice of which level shifter to select and how to size the respective devices for the selected level shifter depends on the particular application and its specifications. For example, higher input voltage swings at A1 and A2 (FIG. 3) may require more stacked devices, or, alternatively, a higher IR drop.

Figure 6:
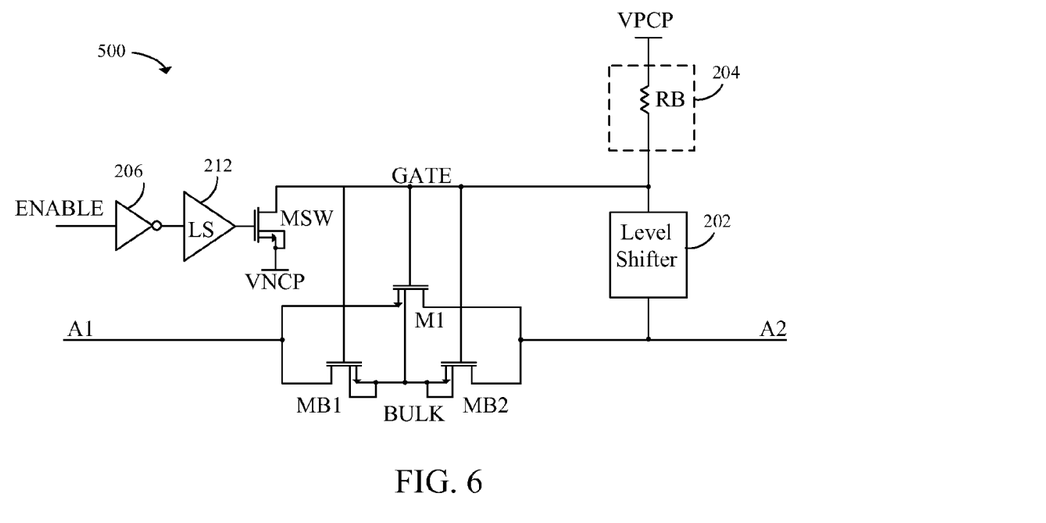
FIG. 6 illustrates a schematic of an another embodiment level shifter.

FIG. 6 illustrates semiconductor switch 500 according to an alternative embodiment. Semiconductor switch 500 is similar to semiconductor switch 200 depicted in FIG. 3, with the exception of current source 204, which is implemented using resistor RB instead of a transistor. In an embodiment, RB is between about 100KΩ and 1MΩ. Details of level shifter 202 and the charge pump have been omitted from FIG. 6 for simplicity of illustration.

Figure 7:
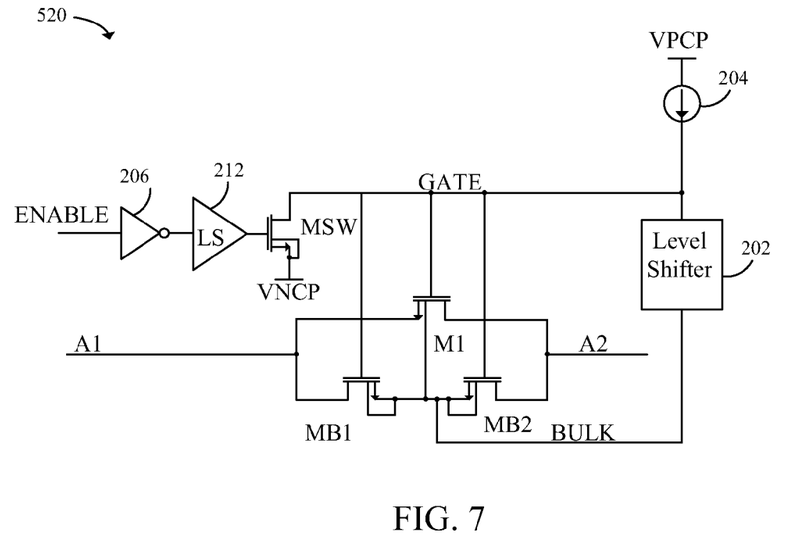
FIG. 7 illustrates a schematic of a further embodiment level shifter.

FIG. 7 illustrates semiconductor switch 520 according to an alternative embodiment. Semiconductor switch 520 is similar to semiconductor switch 200 depicted in FIG. 3, with the exception that node BULK is coupled to the lower input of level shifter 202 instead of node A2.

Figure 8:
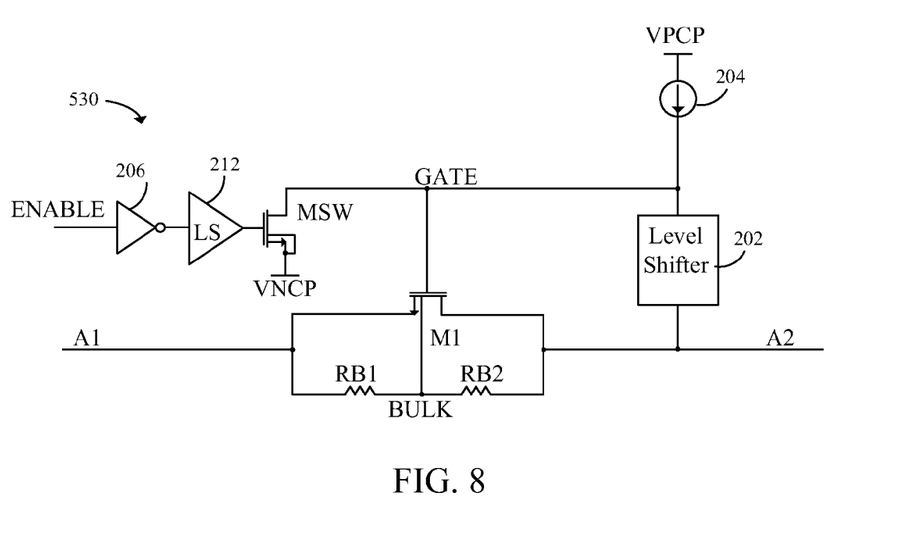
FIG. 8 illustrates a schematic of an alternative embodiment level shifter.

FIG. 8 illustrates semiconductor switch 530 according to an alternative embodiment. Semiconductor switch 530 is similar to semiconductor switch 200 depicted in FIG. 3, with the exception that node BULK is coupled the source and drain of transistor M1 via resistors RB 1 and RB2. Resistors RB1 and RB2 are between about 100KΩ and about 1MΩ.

Figure 9:
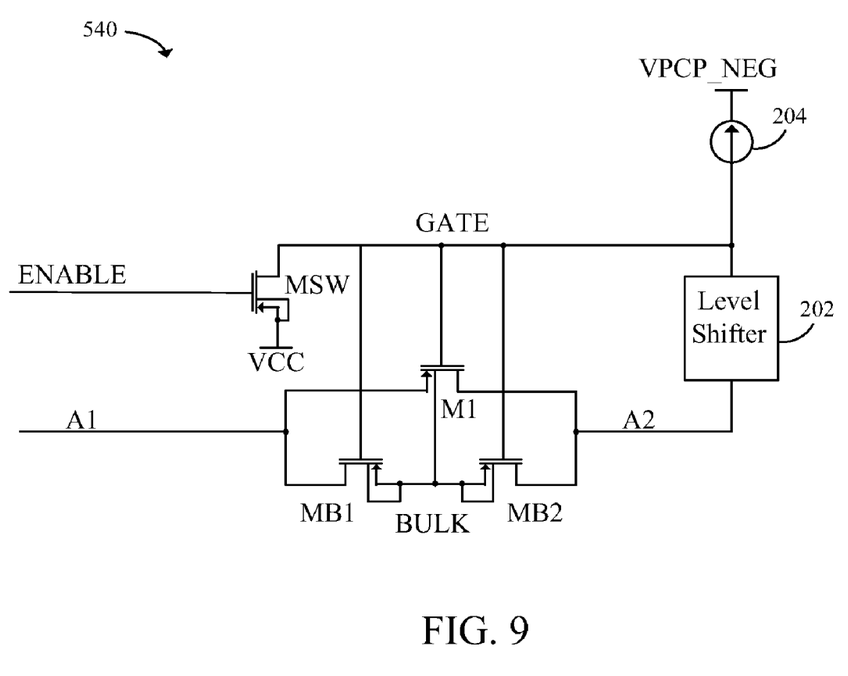
FIG. 9 illustrates a schematic of a further alternative embodiment level shifter.

FIG. 9 illustrates semiconductor switch 540 according to an alternative embodiment. Semiconductor switch 540 is similar to semiconductor switch 200 depicted in FIG. 3, with the exception that transistors M1, MB1, MB2 and MSW are implemented as PMOS devices and current source 204 uses negative power supply VNCP and MSW is referenced to positive supply VCC. Alternatively, MSW can be referenced to charge pump generated positive supply VPCP. Because the polarity of the semiconductor switch 540 is reversed with respect to NMOS implementations, signal ENABLE is coupled to the gate of MSW. In an alternative embodiment, VNCP can be coupled, for example, to ground and/or the source of transistor MSW can be coupled to VCC. The implementation of FIG. 9 can be used in common CMOS processes with p-type substrates that provide separate n-wells for PMOS devices, but not for NMOS devices.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A semiconductor circuit for coupling a first node to a second node, the circuit comprising:
    a first transistor having a first terminal coupled to the first node, a second terminal coupled to the second node, and a control terminal coupled to a control node;
    a bulk node coupling device, the bulk node coupling device comprising a first coupling device coupled between a bulk terminal of the first transistor and the second node;
    a level shifting circuit coupled between the second node and the control node, wherein the level shifting circuit couples the bulk terminal of the first transistor to the control node via the first coupling device, the level shifting circuit comprising a series diode; and
    a supply coupling circuit coupled between a first power supply node and the control node.

2. The semiconductor circuit of claim 1, wherein the bulk node coupling device further comprises a second coupling device coupled between the bulk terminal of the first transistor and the first node.

3. The semiconductor circuit of claim 2, wherein the first and second coupling devices comprise resistors.

4. The semiconductor circuit of claim 2, wherein the first and second coupling devices comprise transistors having gates coupled to the control node.

5. The semiconductor circuit of claim 4, wherein:
    the first transistor comprises an NMOS device; and
    the first and second coupling devices comprise NMOS devices having bulk terminals coupled to the bulk terminal of the first transistor.

6. The semiconductor circuit of claim 1, wherein the supply coupling circuit comprises a resistor.

7. The semiconductor circuit of claim 1, wherein the supply coupling circuit comprises a current source.

8. The semiconductor circuit of claim 1, further comprising a disable switch coupled between the control node and a second power supply node, the disable switch having a control terminal configured to activate the disable switch.

9. The semiconductor circuit of claim 1, wherein the diode comprises a diode connected transistor.

10. The semiconductor circuit of claim 1, wherein the level shifting circuit further comprises a resistor coupled in series with the diode.

11. A switching circuit for coupling a first node to a second node, the switching circuit comprising:
    a first transistor coupled between the first node and the second node;
    a second transistor coupled between the first node and a bulk node of the first transistor;
    a third transistor coupled between the second node and the bulk node of the first transistor;
    a level shifting circuit coupled between the second node and a control node, wherein
        the control node is coupled to the bulk node of the first transistor via the level shifting circuit in series with the third transistor,
        the control node is coupled to control terminals of the first, second and third transistors, and
        the level shifting circuit comprises a diode;
    a current source coupled between the control node and a first power supply node; and
    a switch Coupled between the control node and a second power supply node, the switch comprising a control input.

12. The switching circuit of claim 11, wherein the first, second and third transistors comprise NMOS devices.

13. The switching circuit of claim 12, wherein the second power supply node is configured to be coupled to a negative voltage supply.

14. The switching circuit of claim 13, further comprising a charge pump coupled to the second power supply node, the charge pump configured to provide a negatively boosted supply voltage.

15. The switching circuit of claim 11, wherein the diode comprises a plurality of diode connected MOS devices coupled in series.

16. The switching circuit of claim 11, wherein the level shifting circuit further comprises a resistor coupled in series with the diode.

17. The switching circuit of claim 11, further comprising a charge pump coupled to the first power supply node, the charge pump configured to provide a positively boosted supply voltage.

18. A method of operating a semiconductor switch comprising a first transistor coupled between a first node and a second node, a second transistor coupled between the first node and a bulk node of the first transistor, a third transistor coupled between the second node and the bulk node of the first transistor, a level shifting circuit coupled between the second node and a control node, a current source coupled between the control node and a first power supply node, wherein the control node is coupled to control terminals of the first, second and third transistors, the level shifting circuit comprises a diode, the method comprising:
   enabling the semiconductor switch, enabling comprising:
      opening a control switch coupled between the control node and a second power supply node to allow current to flow from the current source through the level shifting circuit, opening comprising changing a state of an enable signal coupled to the control switch to a first state, and
      biasing the first transistor with a voltage across the level shifting circuit to achieve a fixed resistance between the first node and the second node, biasing comprising coupling the control node to the bulk node via a series combination of the level shifting circuit and the third transistor.

* * * * *